US011081156B2

(12) United States Patent
Gupta et al.

(10) Patent No.: US 11,081,156 B2
(45) Date of Patent: Aug. 3, 2021

(54) VOLTAGE REGULATION CIRCUITRY

(71) Applicant: Arm Limited, Cambridge (GB)

(72) Inventors: Surya Prakash Gupta, Noida (IN); El Mehdi Boujamaa, Valbonne (FR); Cyrille Nicolas Dray, Antibes (FR); Piyush Jain, Noida (IN); Akshay Kumar, New Delhi (IN)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/504,072

(22) Filed: Jul. 5, 2019

(65) Prior Publication Data

US 2021/0005237 A1 Jan. 7, 2021

(51) Int. Cl.
*G11C 11/16* (2006.01)
(52) U.S. Cl.
CPC ........ *G11C 11/1697* (2013.01); *G11C 11/161* (2013.01); *G11C 11/1675* (2013.01); *G11C 11/1693* (2013.01)
(58) Field of Classification Search
CPC .............. G11C 11/1697; G11C 11/161; G11C 11/1675; G11C 11/1693
USPC ......................................................... 365/158
See application file for complete search history.

(56) References Cited

U.S. PATENT DOCUMENTS

| 4,975,883 | A * | 12/1990 | Baker .................. G11C 16/225 365/185.02 |
| 6,927,606 | B2 * | 8/2005 | Kocaman ......... H03K 19/01707 327/108 |
| 9,899,913 | B2 * | 2/2018 | Chang ................... H02M 3/156 |
| 10,591,938 | B1 * | 3/2020 | Golara ...................... G05F 1/59 |
| 10,623,218 | B2 * | 4/2020 | Kunc ....................... H03D 1/02 |
| 2011/0057727 | A1 * | 3/2011 | Cranford, Jr. ......... H03F 1/3211 330/253 |
| 2016/0125927 | A1 * | 5/2016 | Wei ...................... G11C 11/1673 365/148 |
| 2017/0255214 | A1 * | 9/2017 | Ho ........................ H02M 3/158 |
| 2017/0323669 | A1 * | 11/2017 | Lee ..................... G11C 13/0038 |
| 2018/0191359 | A1 * | 7/2018 | Petrov ..................... H03L 7/093 |
| 2020/0186137 | A1 * | 6/2020 | Jiang .................... H03K 5/1515 |
| 2020/0227103 | A1 * | 7/2020 | Shao ....................... G11C 16/24 |

* cited by examiner

*Primary Examiner* — Fernando Hidalgo
(74) *Attorney, Agent, or Firm* — Pramudji Law Group PLLC; Ari Pramudji (57) ABSTRACT

Various implementations described herein are directed to device having a clock generator that provides write reference signals. The device may include a voltage divider that receives the write reference signals and provides an output reference signal based on write polarity of the write reference signals. The device may include a voltage regulator that receives the output reference signal and provides a regulated voltage to a load based on the output reference signal.

17 Claims, 5 Drawing Sheets

VOLTAGE REGULATION CIRCUITRY

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional circuit designs, asymmetric write behavior of magnetic memory elements typically require different reference voltages for different write operations. Some write operations may be simpler to perform than other write operations that may require lower reference voltages. In some cases, writing to magnetic memory elements may also require regulated voltages for supplying voltage to write drivers based on process corners due to endurance. Thus, some write operations may require higher write driver voltages than other write operations. If the regulated voltage is kept the same for different write operations, then the regulated voltage may cause endurance issues for magnetic memory elements due to high stress. As such, there exists a need to improve physical design for providing a regulated voltage to write drivers for magnetic memory elements.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to voltage regulation schemes and techniques for magneto-resistive random access memory (MRAM). For instance, the various schemes and techniques described herein provide for a data dependent voltage mode write operation for magneto-resistive random access memory (MRAM).

Various implementations of voltage regulation schemes and techniques will be described in detail herein with reference to FIGS. 1-5.

Figure 1:
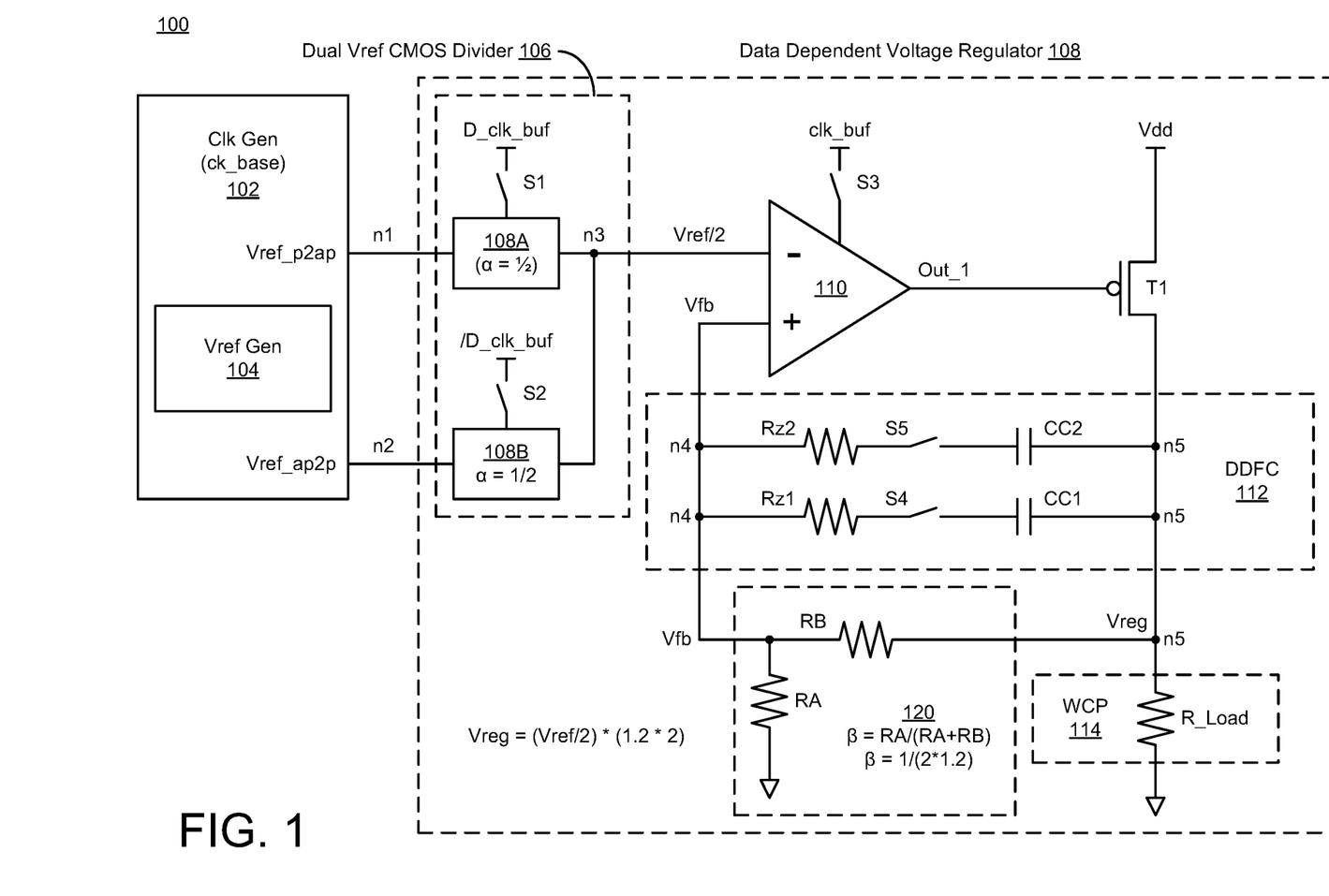
FIG. 1 illustrates a diagram of voltage regulation circuitry in accordance with various implementations described herein.

FIG. 1 illustrates a diagram of voltage regulation circuitry 100 in accordance with various implementations described herein. In some instances, the voltage regulation circuitry 100 may be implemented as an integrated circuit in a system or a device having various circuit components that are arranged and coupled together as an assemblage or combination of parts that provide for a physical circuit design and related structures. Also, in some instances, a method of designing, providing and building the voltage regulation circuitry 100 may involve use of the various circuit components described herein so as to thereby implement various schemes and techniques associated therewith.

In reference to FIG. 1, the voltage regulation circuitry 100 may include a clock generator 102 (Clk Gen or ck_base) that provides one or more write reference signals (Vref_p2ap, Vref_ap2p) for P2AP (D1) and AP2P (D0) via nodes (n1, n2), respectively. In some instances, the clock generator 102 may be configured to generate various other clock signals, such as, e.g., clk_buf, D_clk_buf, /D_clk_buf, WR_CLK and NWR_CLK signals.

The voltage regulation circuitry 100 may include a reference voltage generator 104 (Vref Gen) that is configured to generate the one or more write reference signals (Vref_p2ap, Vref_ap2p) for regulating write voltages, and their voltage level may be associated with one or more trim control signals (p2ap_trim<2:0> and ap2p_trim<2:0>). The write reference signals (Vref_p2ap, Vref_ap2p) may be referred to as input reference signals. The write reference signals (Vref_p2ap, Vref_ap2p) may include a first write reference signal (Vref_p2ap) and a second write reference signal (Vref_ap2p) that is different than the first write reference signal (Vref_p2ap), and also, use of the first write reference signal (Vref_p2ap) or the second write reference signal (Vref_ap2p) may be associated with the trim control signals (p2ap_trim<2:0> and ap2p_trim<2:0>). In various instances, the write reference signals (Vref_p2ap and Vref_ap2p) may be adjusted within certain ranges with assistance from the trim control signals (p2ap_trim<2:0> and ap2p_trim<2:0>), which may also be referred to as write trim control signals. The reference voltage generator 104 (Vref Gen) is described further herein below in reference to FIG. 2.

The voltage regulation circuitry 100 may include a reference voltage divider 106 that is configured to receive the write reference signals (Vref_p2ap, Vref_ap2p) via nodes (n1, n2) and provide a reference signal (Vref/2) to an operational amplifier 110 based on write polarity and/or based on clock arrival. The reference signal (Vref/2) may be referred to as an output reference signal. The reference voltage divider 106 may receive the write reference signals (Vref_p2ap, Vref_ap2p), and provide the output reference signal which is half (½) of the write reference signals as a proportional reference signal (Vref/2) based on the selected write reference signals (Vref_p2ap, Vref_ap2p) depending on write polarity. In some instances, a voltage level of the reference signal (Vref/2) may be proportional (e.g., one-half, with α=½, or 0.5) to a voltage level of the write reference signals (Vref_p2ap, Vref_ap2p), and the reference voltage divider 106 provides the reference signal (Vref/2) based on arrival of one or more clock signals (D_clk_buf, /D_clk_buf) from the clock generator 102 (ck_base). The reference voltage divider 106 may refer to a divide-by-2 voltage divider, and thus, the voltage level of the reference signal (Vref/2) may be one-half of the voltage level of the write reference signals (Vref_p2ap, Vref_ap2p). In some instances, the reference voltage divider 106 may be implemented as a dual complementary metal-oxide-semiconductor (CMOS) reference voltage (Vref) divider that assists with isolation of the reference signal (Vref/2) from noise generated by voltage regulation. In some instances, the reference voltage divider 106 may include clocked multiplexer circuitry (108A, 108B) that is configured to select the first reference signal (Vref_p2*ap*) or the second reference signal (Vref_ap2*p*) based on arrival of the clock signal (clk_buf) from the clock generator 102.

The voltage regulation circuitry 100 may include a voltage regulator 108 that is configured to receive the reference signal (Vref/2) and provide a regulated voltage (Vreg) to a load (R_Load) based on the selected reference signal (Vref/2). The reference signal (Vref/2) refers to a proportional reference signal (Vref/2), which may have a voltage level that is one-half of the voltage level of the write reference signals (Vref_p2*ap*, Vref_ap2*p*). In some instances, the voltage regulator 108 includes an operational amplifier 110 that receives the reference voltage (Vref), receives a feedback signal (Vfb), and provides an output control signal (Out_1) based on the input signals (Vref/2, Vfb) to control a gate of pass transistor (T1). This gate control of the pass transistor (T1) allows for regulating the supply voltage (Vdd) passing to the load (R_Load) as the regulated voltage (Vreg). As such, in this instance, the pass transistor (T1) may be coupled between the supply voltage (Vdd) and the load (R_Load), and the pass transistor (T1) may be activated by the output (Out_1) of the operational amplifier 110. In various instances, the regulated voltage (Vreg) may less than (<), equal to (=), or proportional to the supply voltage or write reference voltage (Vdd or Vref_p2*ap*/Vref_ap2*p*). For instance, the regulated voltage (Vreg) may be as follows:

$$Vreg = \frac{Vfb}{\beta} = \frac{Vref * \alpha}{\beta} = \frac{Vref}{2} * (1.2 * 2) = Vref * 1.2$$

In some implementations, Vref may range between 1.2V and 1.315V @ −40° C., and as such, Vreg may range between (1.2*1.2)V and (1.315*1.2)V @ −40° C.

In some instances, the feedback divider 120 may be coupled between an output of the pass transistor (T1) and the non-inverting input (+) of the operational amplifier 110. Also, the operational amplifier 110 may receive the reference signal (Vref/2) at an inverting input (−) and receive the feedback voltage (Vfb) at a non-inverting input (+). The feedback voltage (Vfb) may be provided by a feedback divider 120 (e.g., with β=(R1/(R1+R2))=1/(2*1.2)) that is coupled to the output (Out_1) of the operational amplifier 110 via the pass transistor (T1). The beta (β) factor in this resistive divider implementation may be referred to as a feedback factor. In some instances, the operational amplifier 110 may be implemented as an error amplifier that uses dynamic body biasing (DBB) to reduce static leakage while providing increased voltage headroom to biasing current source, which is described herein below in reference to FIG. 3. Also, the load (R_Load) may refer to a memory circuit having, e.g., write critical path (WCP) circuitry 114 for magneto-resistive random access memory (MRAM), which is described herein below in FIG. 4.

The voltage regulation circuitry 100 may include a frequency compensation circuit 112 that may be configured to control overshoot across the load (R_Load), such as, e.g., the memory circuit (WCP 114). The voltage regulator 108 may be clocked with a clock signal (clk_buf) from the clock generator 102 so as to thereby operate with reduced static power, and the voltage regulator 108 may provide the regulated voltage (Vreg) to the memory circuit (WCP 114) based on arrival of the clock signal (clk_buf) from the clock generator 102. In some instances, the frequency compensation circuit 112 may refer to a data dependent frequency compensation (DDFC) circuit, and also, the regulated voltage (Vreg) may refer to a data dependent regulated voltage for write operations that uses the reference voltage (Vref/2) for increased endurance of the memory circuit (WCP 114). As described herein below, the memory circuit (WCP 114) may include a magnetic tunneling junction (MTJ), and the frequency compensation circuit 112 may be configured to control overshoot across the memory circuit for different data polarity and MTJ endurance.

In some implementations, the frequency compensation circuit 112 may include one or more sets of resistors (Rz1, Rz2) and capacitors (CC1, CC1) coupled in series between the non-inverting input (+) of the operational amplifier 110 at node (n5) and the output of the pass transistor (T1) at node (n6). For instance, a first set of a resistor (Rz1) and a capacitor (CC1) may be coupled in parallel with a second set of a second resistor (Rz2) and a second capacitor (CC2). Also, switches (s4, s5) may be coupled between the sets of resistors (Rz1, Rz2) and capacitors (CC1, CC2). As shown, the switches (s4, s5) may be used for switching frequency compensation in different frequency ranges by separately switching (activating and deactivating) each of sets of resistors (Rz1, Rz2) and capacitors (CC1, CC2) on or off. In some instances, Rz1 and CC1 may be used for p2*ap* write compensation when D=1, and Rz1 and CC1 plus Rz1 and CC2 may be used for ap2*p* write compensation when D=0.

In some implementations, the reference voltage (Vref) may be generated inside of the clock generator 102 (ck_base), and the reference voltage (Vref) may be coupled to input-output (IO) circuits for voltage regulator reference. The dual Vref CMOS divider 106 may be used (with α factor=½) to isolate a global Vref from noise generated by the voltage regulator 108. The α=½ factor may be used to bring the input reference voltage close to Vref/2 under a common mode input range of the operational amplifier 110. Also, the voltage regulator reference signals (vref_p2*ap*/Vref_ap2*p*) may be selected based on the write data by a clocked multiplexer integrated with the dual Vref CMOS divider 106. In some instances, to decouple switching noise coming from the data dependent Vref selection or clock, decoupling capacitance may be needed in each IO. In some instances, there may be no static current consumption from the IOs during an idle state. Also, the feedback divider (e.g., β factor) may be formed as a poly-resistor. Also, in a regulator bypass mode of the input buffers, the feedback loop and the amplifier may be turned-off or deactivated, and Vreg may become equal to the supply voltage (~Vdd).

In some implementations, a data dependent regulated voltage write operation may be performed using the co-efficients (α=½ and β=1/(2*1.2)) in dual Vref CMOS divider 106 for improved endurance. Also, the dual Vref CMOS divider 106 may provide for area efficiency and low-cost high input impedance for implementing a precise half-divider that may be controlled based on write polarity of data signals (e.g., Data_0 AP2P or Data_1 P2AP) upon clock arrival. The dual Vref CMOS divider 106 may be configured to isolate any noise coupling back to the write drivers and related components, which may provide for small global PVT variation (e.g., <1%) and small local variation (e.g., <1%/sigma). In some implementations, data dependent frequency compensation may be used to control overshoot across the MTJ element for different data polarity for MTJ endurance. Further, dynamic body biasing of input transistors of the operational amplifier 110 may be used to reduce static leakage while optimizing voltage headroom for a current source. In addition, the voltage reference regulator 108 is clocked, so as to provide small static power in an idle state.

The voltage regulation circuitry 100 including the components therein may be implemented as an integrated circuit (IC) with memory circuitry, such as, e.g., MRAM, and/or any other similar types of memory. The voltage regulation circuitry 100 may also be integrated with computing circuitry and related components on a single chip. Further, the voltage regulation circuitry 100 may be implemented in embedded systems for various types of electronic, mobile, Internet-of-Things (IoT) and/or biometric applications.

Figure 2:
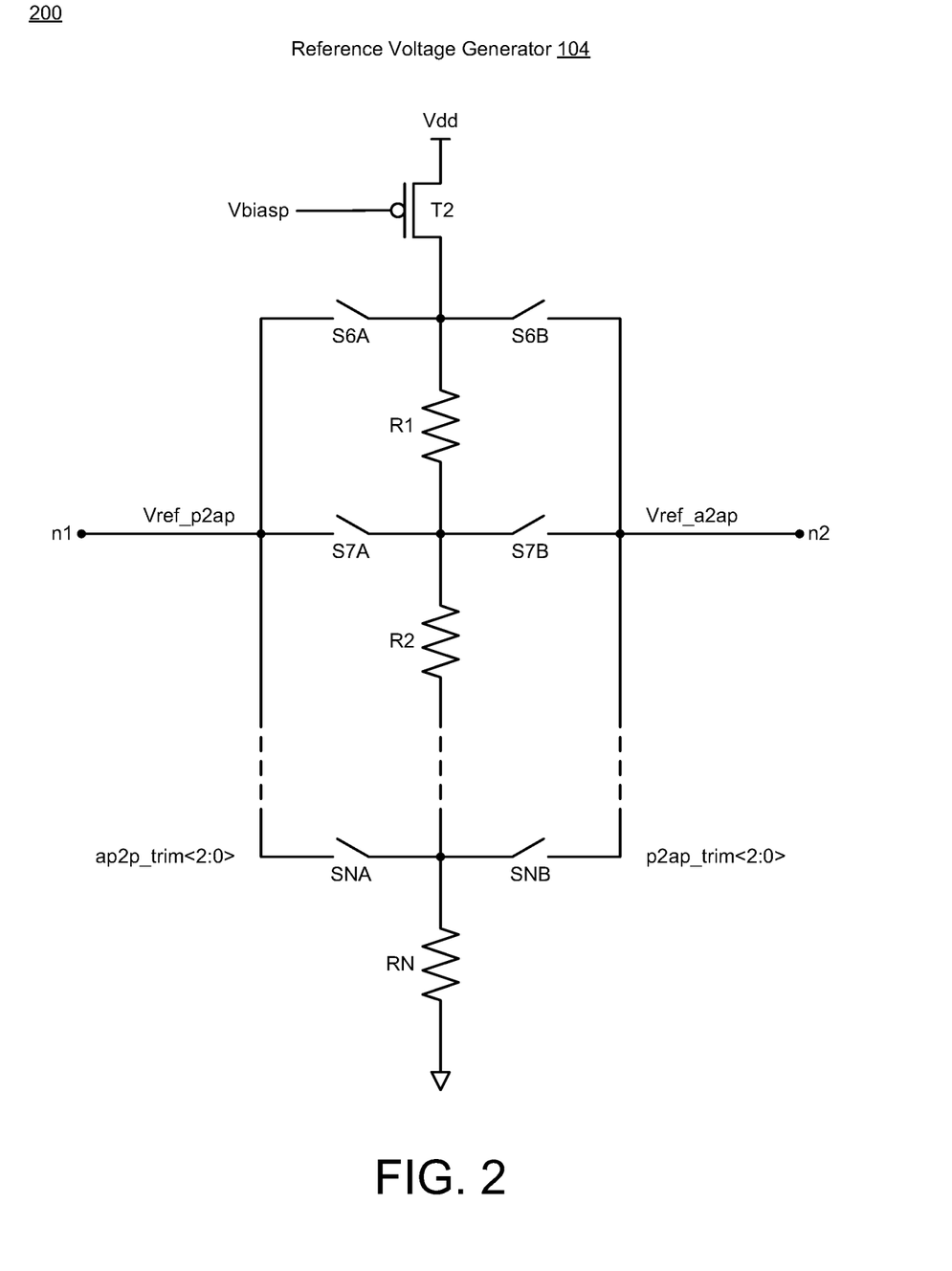
FIG. 2 illustrates a diagram of a reference voltage generator in accordance with various implementations described herein.

FIG. 2 illustrates a schematic diagram 200 of the reference voltage generator 104 in accordance with various implementations described herein.

As shown in FIG. 2, the reference voltage generator 104 includes a header transistor (T2) coupled between the supply voltage (Vdd) and a series-coupled resistor network (R1, R2, . . . , RN), which may include any number (N) of resistors. The header transistor (T2) may be activated with a voltage bias signal (Vbiasp) that is coupled to a gate thereof. The reference voltage generator 104 includes a switching network S6A, S6B, S7A, S7B, . . . , SNA, SNB), which may include any number (N) of switches. In this instance, switch S6A may be coupled between the Vref node (Vref_p2ap) and an output of the header transistor (T2), and switch S6B may be coupled between the Vref node (Vref_ap2p) and the output of the header transistor (T2). Vref node (Vref_p2ap) refers to node (n1) in FIG. 1, and Vref node (Vref_ap2p) refers to node (n2) in FIG. 1.

In some instances, the header transistor (T2) may include a p-type metal-oxide-semiconductor (PMOS) transistor. However, in other instances, the header transistor (T2) may be implemented with an n-type MOS (NMOS) transistor.

Switch S7A may be coupled between the Vref node (Vref_p2ap) and the output of the header transistor (T2), and switch S7B may be coupled between the Vref node (Vref_ap2p) and the output of the header transistor (T2). Also, a first resistor (R1) may be coupled between switches (S6A, S6B) and switches (S7A, S7B). In some instances, a number (N) of other switches SNA may be coupled between Vref node (Vref_p2ap) and the output of the header transistor (T2), and also, a number (N) of other switches SNB may be coupled between Vref node (Vref_ap2p) and the output of the header transistor (T2). Also, a second resistor (R2) may be coupled between switches (S7A, S7B) and switches (SNA, SNB). The reference voltage generator 104 may include a footer resistor (RN) coupled between the series-coupled resistor network (R1, R2, . . . , RN) and ground (Vss, Gnd). The number of other switches (SNA, SNB) may be used as trimming switches to selectively provide one or more trimming voltage signals (e.g., ap2p_trim<2:0> and/or p2ap_trim<2:0>) to corresponding Vref nodes (Vref_p2ap, Vref_ap2p).

Figure 3:
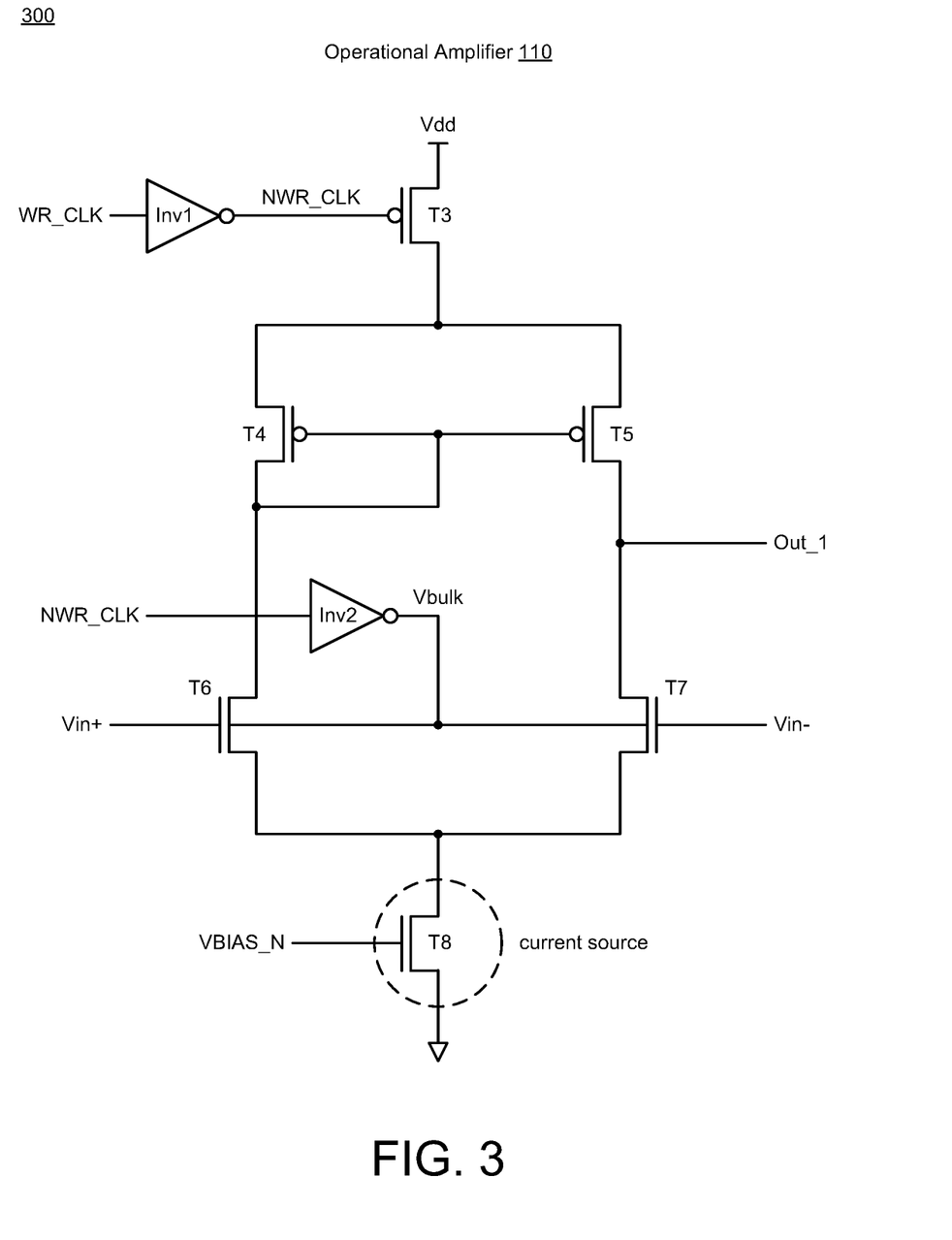
FIG. 3 illustrates a diagram of operation amplifier circuitry in accordance with various implementations described herein.

FIG. 3 illustrates a schematic diagram 300 of the operation amplifier circuitry 110 in accordance with various implementations described herein.

As shown in FIG. 3, the operational amplifier circuitry 110 includes a header transistor (T3) coupled between the supply voltage (Vdd) and transistors (T4, T5). The header transistor (T3) may be activated with an inverted write clock signal (NWR_CLK) that is coupled to a gate thereof. As shown, an inverter (Inv1) receives a write clock signal (WR_CLK) and provides the inverted write signal (NWR_CLK) to the gate of the header transistor (T3) for activation thereof. Transistor (T4) may be coupled between an output of header transistor (T3) and transistor (T6), and transistor (T5) may be coupled between the output of header transistor (T3) and transistor (T7). Transistor (T4) may be coupled as a diode. Also, gates of transistors (T4, T5) may be coupled together, and an output of transistor (T4) may be coupled to the gates of transistors (T4, T5) such that transistor (T4) is coupled as a diode. Transistor (T6) may be coupled between transistor (T4) and footer transistor (T8), and transistor (T7) may be coupled between transistor (T5) and the footer transistor (T8). The non-inverting input (Vin+) may be coupled to a gate of transistor (T6), and inverting input (Vin−) may be coupled to a gate of transistor (T7). As shown, another inverter (Inv2) may receive the inverted write clock signal (NWR_CLK) and then provide the write signal (WR_CLK, as a Vbulk signal) to forward body bias transistors (T6, T7). The footer transistor (T8) may be coupled as a current source between transistors (T6, T7) and ground (Vss, Gnd), and a biasing signal (VBIAS_N) may be coupled to a gate of the footer transistor (T8) for current biasing thereof. In addition, the output signal (Out_1) may be taken from a node coupled between transistors (T5, T7).

In some instances, the header transistor (T3) and the transistors (T4, T5) may include PMOS transistors, and the transistors (T6, T7) and the footer transistor (T8) may include NMOS transistors. However, in other instances, the header transistor (T2) and the transistors (T4, T5) may implemented with NMOS transistors, and the transistors (T6, T7) and the footer transistor (T8) may be implemented with PMOS transistors.

In some implementations, the forward body biasing (FBB) applied to a bulk of devices (T6, T7) may be used to reduce drop across the input devices (T6, T7), and the forward body biasing (FBB) may assist the footer transistor (T8) to be in deep saturation (so as to act as current source). Also, the dynamic body biasing (DBB) of the transistors (T6, T7) may provide for low local variation (in active mode), and a static leakage path may be reduced via input devices (T6, T7) when the operational amplifier 110 is not being used (e.g., when CLK=0).

Figure 4:
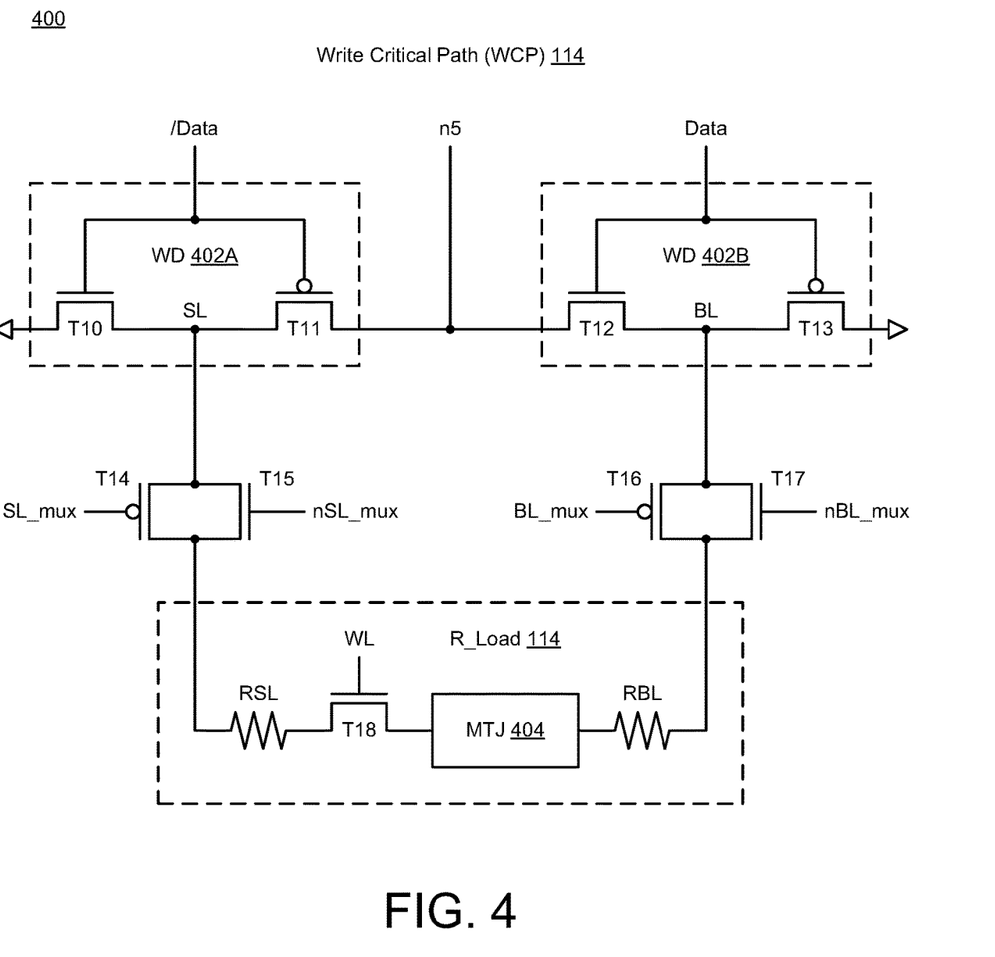
FIG. 4 illustrates a diagram of write critical path circuitry in accordance with various implementations described herein.

FIG. 4 illustrates a diagram 400 of the write critical path (WCP) circuitry 114 in accordance with various implementations described herein.

As shown in FIG. 4, the WCP circuitry 114 includes one or more write drivers, including, e.g., a first write driver (WD) 402A and a second write driver (WD) 402B. The first write driver 402A may include an inverter structure that receives a first data signal (/Data) at gates of transistors (T10, T11) and provides an output data signal on a source line (SL), and second write driver 402B may also include another inverter structure that receives a second data signal (Data) at gates of transistors (T12, T13) and provide another output data signal on a bitline (BL). Also, as shown, the write drivers 402A, 402B are coupled between node (n5) from FIG. 1 and ground (Vss, Gnd). The WCP circuitry 114 may include a source line pass transistors (T14, T15) that are coupled between the first write driver (WD 402A) and the load (R_Load), and the WCP circuitry 114 may include a bitline pass transistors (T16, T17) that are coupled between the second write driver (WD 402B) and the load (R_Load). As shown, the load (R_Load) may be coupled between the source line pass transistors (T14, T15) and the bitline pass transistors (T16, T17). Also, in some instances, source line multiplexer signals (SL_mux, nSL_mux) may be coupled to gates of the source line pass transistors (T14, T15) for activation thereof, and bitline multiplexer signals (BL_mux, nBL_mux) may be coupled to the gates of the bitline pass transistors (T16, T17) for activation thereof.

In some implementations, the load (R_Load) includes one or more components, such as, e.g., an effective source line resistor (RSL), an effective bitline resistor (RBL), a pass transistor (T18), and a magnetic tunneling junction (MTJ) 404. As shown in FIG. 4, these components (RSL, T18, MTJ and RBL) are coupled in series between the source line (SL) and the bitline (BL). For instance, the source line resistor (RSL) may be coupled between the source line pass transistors (T14, T15) and the pass transistor (T18), and the bitline resistor (RBL) may be coupled between the bitline pass transistors (T16, T17) and the magnetic tunneling junction (MTJ) 404. Also, the pass transistor (T18) may be coupled between the source line resistor (RSL) and the magnetic tunneling junction (MTJ) 404, and the magnetic tunneling junction (MTJ) 404 may be coupled between the pass transistor (T18) and the bitline resistor (RBL). In some instances, a wordline signal (WL) may be coupled to pass transistor (T18) for activation thereof.

In some instances, the transistors (T11, T13, T14, T16) may include PMOS transistors, and the transistors (T10, T12, T15, T17, T18) may include NMOS transistors. However, in other instances, transistors (T11, T13, T14, T16) may be implemented with NMOS transistors, and transistors (T10, T12, T15, T17, T18) may be implemented with PMOS transistors.

Figure 5:
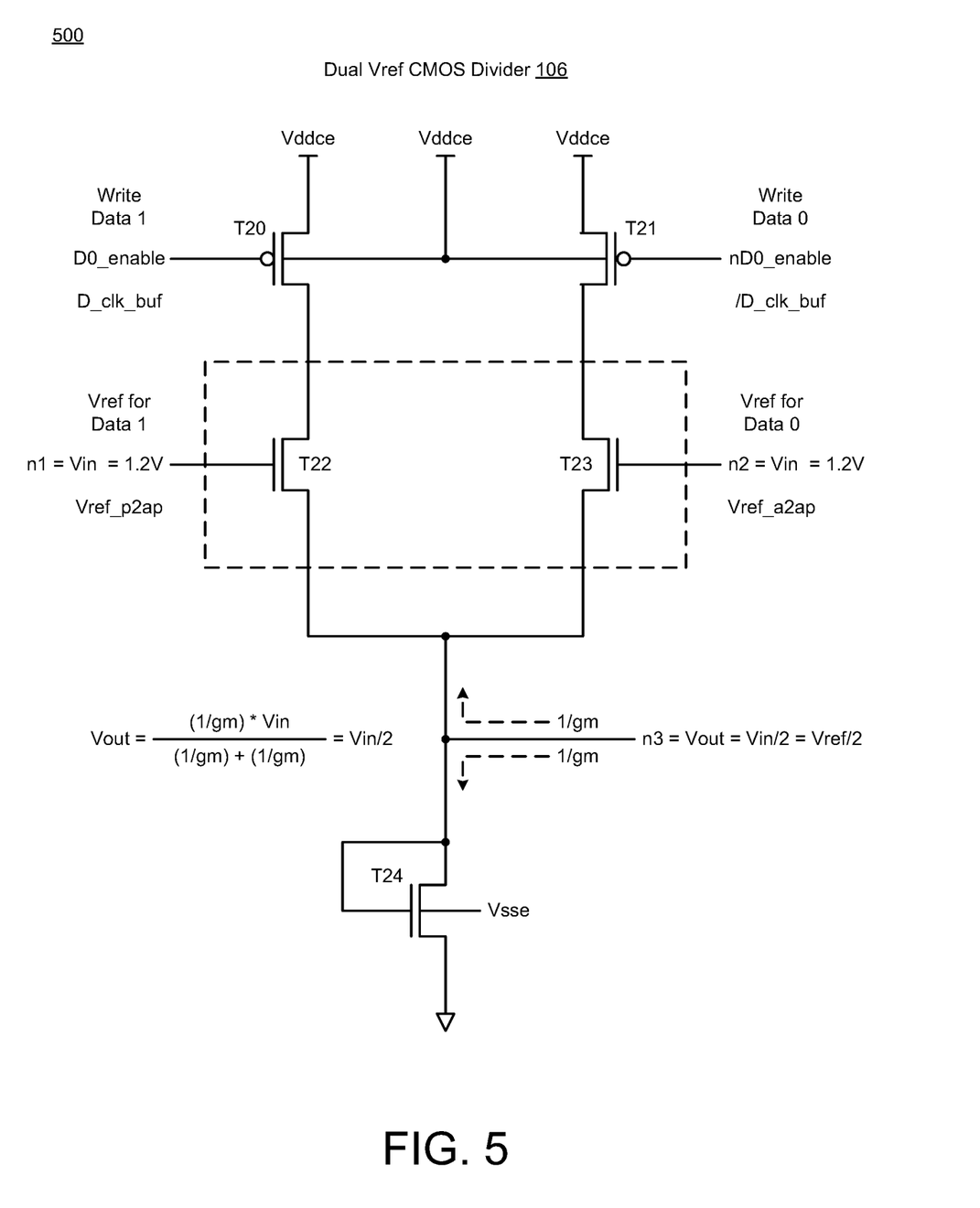
FIG. 5 illustrates a diagram of a voltage reference divider in accordance with various implementations described herein.

FIG. 5 illustrates a diagram 500 of a voltage reference (Vref) divider circuitry 106 in accordance with various implementations described herein. In some instances, the Vref divider circuitry 106 shown in FIG. 5 may refer to the dual Vref CMOS divider 106 shown in FIG. 1, and in this instance, the Vref divider circuitry 106 may include the clocked multiplexer circuitry (108A, 108B) that is configured to select the first reference signal (Vref_p2ap) or the second reference signal (Vref_ap2p) based on arrival of the clock signal (clk_buf) from the clock generator 102.

As shown in FIG. 5, the Vref divider circuitry 106 includes header transistors (T20, T21) that are coupled between a core supply voltage (Vddce) and transistors (T22, T23), respectively. The core supply voltage (Vddce) may be coupled to a biasing terminal of transistors (T20, T21) for biasing thereof. Also, a write data 1 signal (D0_enable) may be coupled to a gate of transistor (T20) as an enable/activation signal, and a write data 0 signal (nD0_enable) may be coupled to a gate of transistor (T21) as an enable/activation signal. In some instances, the write data 1 signal (D0_enable) refers to the clock signal (D_clk_buf) in FIG. 1, and the write data 0 signal (nD0_enable) refers to the clock signal (/D_clk_buf) in FIG. 1.

In some instances, transistor (T22) may be coupled between transistor (T20) and footer transistor (T24), and transistor (T23) may be coupled between transistor (T21) and footer transistor (T24). Also, in some instances, the Vref signal for data 1 (Vref_p2ap) may be coupled to a gate of the transistor (T22), and the Vref signal for data 0 (Vref_ap2p) may be coupled to a gate of the transistor (T23), In some instances, the Vref signal for data 1 (Vref_p2ap) has a voltage level similar to a node voltage at node (n1=Vin=1.2V), and the Vref signal for data 0 (Vref_ap2p) has a voltage level similar to a node voltage at node (n2=Vin=1.2V).

In some instances, footer transistor (T24) may be coupled between transistors (T22, T23) and ground (Vss, Gnd), and as shown, transistor (T24) may be coupled as a diode with its biasing terminal coupled to core ground (Vsse). The Vref divider circuitry 106 has an output at a node coupled between outputs of transistors (T22, T23) and footer transistor (T24). The output node may refer to node (n3) of FIG. 1, wherein node (n3) may refer to an output voltage (Vout=Vin/2=Vref/2). Also, the output node (n2) may have a transconductance (1/gm), wherein the output voltage may be as follows:

$$Vout = \frac{\left(\frac{1}{gm}\right) * Vin}{(1/gm) + (1/gm)} = \frac{Vin}{2} = \frac{Vref}{2}$$

In some implementations, the term "gm" is the transconductance of the device and "1/gm" provides the impedance when looking into the direction of the arrows shown in FIG. 5. At the Vout node (n3), the impedance seen towards the source terminals of transistors (T22, T23) is "1/gm", and the impedance of transistor (T24) is also "1/gm" due to a similar voltage threshold (Vth) and transistor size. Thus, a resistive division output at the Vout node (n3) is Vout=R2/(R1+R2) *Vin=(1/gm)/(1/gm+1/gm)*Vin=Vin/2.

In some instances, the transistors (T20, T21) may include PMOS transistors, and the transistors (T22, T23, T24) may include NMOS transistors. However, in other instances, the transistors (T20, T21) may be implemented with NMOS transistors, and transistors (T22, T23, T24) may be implemented with PMOS transistors.

Described herein are various implementations of a device. The device may include a clock generator that provides write reference signals. The device may include a voltage divider that receives the write reference signals and provides an output reference signal based on write polarity of the write reference signals. The device may include a voltage regulator that receives the output reference signal and provides a regulated voltage to a load based on the output reference signal.

Described herein are various implementations of a device. The device may include a clock generator that provides write reference signals. The device may include a voltage divider that receives the write reference signals and provides an output reference signal that is proportional to a selected write reference signal of the write reference signals. The device may include a voltage regulator that receives the output reference signal and provides a regulated voltage to a memory circuit based on the output reference signal. The voltage regulator may have a frequency compensation circuit that controls overshoot across a component of the memory circuit.

Described herein are various implementations of a device. The device may include a clock generator having a reference voltage generator that provides write reference signals for regulating write voltages associated with write operations. The device may include a voltage divider that receives the write reference signals, receives the write reference signals, and provides a proportional reference signal based on a selected reference signal of the write reference signals. The device may include a voltage regulator that receives the proportional reference signal and provides a regulated voltage to a load based on the proportional reference signal.

Described herein are various implementations of a device. The device may include a clock generator that provides write reference signals. The device may include a voltage divider that receives the write reference signals and provides an output reference signal that is proportional to a selected write reference signal of the write reference signals. The device may include a voltage regulator that receives the output reference signal and provides a regulated voltage to a load based on the output reference signal. The voltage regulator may include an amplifier that uses dynamic body biasing of an input transistor to reduce static leakage while providing increased voltage headroom to a current source.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device, comprising:
 a clock generator that generates a clock signal and provides write reference signals generated inside the clock generator;
 a voltage divider that receives the write reference signals and provides an output reference signal based on: write polarity of the write reference signals; and
 a voltage regulator that receives the output reference signal and provides a regulated voltage to a load based on the output reference signal.

2. A device comprising:
 a clock generator that generates a clock signal and provides write reference signals;
 a voltage divider that receives the write reference signals and provides an output reference signal based on: write polarity of the write reference signals; and
 a voltage regulator that receives the output reference signal and provides a regulated voltage to a load based on the output reference signal;
 wherein a voltage level of the write reference signals is trimmed differently for the write polarity based on one or more trimming signals, and wherein the voltage divider provides the output reference signal based on arrival of the clock signal from the clock generator.

3. A device, comprising:
 a clock generator that provides write reference signals;
 a voltage divider that receives the write reference signals and provides an output reference signal based on write polarity of the write reference signals; and
 a voltage regulator that receives the output reference signal and provides a regulated voltage to a load based on the output reference signal;
 wherein the voltage divider comprises a divide-by-2 voltage divider, and wherein the voltage level of the write reference signals is selected based on the write reference signals when a clock signal arrives from the clock generator.

4. The device of claim 1, wherein the voltage divider is a complementary metal-oxide-semiconductor (CMOS) voltage divider that assists with isolation of the output reference signal from noise generated by the voltage regulator.

5. The device of claim 1, wherein the load comprises write critical path circuitry for magneto-resistive random access memory (MRAM).

6. A device, comprising:
 a clock generator that provides write reference signals;
 a voltage divider that receives the write reference signals and provides an output reference signal that is proportional to a selected write reference signal of the write reference signals; and a voltage regulator that receives the output reference signal and provides a regulated voltage to a memory circuit based on the output reference signal, the voltage regulator having a frequency compensation circuit that controls overshoot across a component of the memory circuit;

wherein the voltage regulator is clocked with a clock signal from the clock generator so as to thereby operate with reduced static power, and wherein the voltage regulator provides the regulated voltage to the memory circuit based on arrival of the clock signal from the clock generator.

7. The device of claim 6, wherein the frequency compensation circuit comprises a data dependent frequency compensation circuit, and wherein the regulated voltage comprises a data dependent regulated voltage for write operations that uses the output reference voltage for increased endurance of the memory circuit.

8. The device of claim 6, wherein the component of the memory circuit comprises a magnetic tunneling junction (MTJ), and wherein the frequency compensation circuit is configured to control overshoot across the MTJ of the memory circuit for different data polarity and MTJ endurance.

9. The device of claim 6, wherein the memory circuit comprises a write critical path circuit for magneto-resistive random access memory (MRAM).

10. A device, comprising:
a clock generator having a reference voltage generator that provides write reference signals for regulating write voltages associated with write operations;
a voltage divider that receives the write reference signals and provides a proportional reference signal based on a selected reference signal of the write reference signals; and
a voltage regulator that receives the proportional reference signal and provides a regulated voltage to a load based on the proportional reference signal;
wherein the write reference signals comprise a first write reference signal and a second write reference signal that is different than the first write reference signal, and wherein the first write reference signal or the second write reference signal is selected based on write data associated with the write reference signals.

11. The device of claim 10, wherein a voltage level of the proportional reference signal is one-half of a voltage level of the write reference signals.

12. The device of claim 10, wherein the voltage divider has a clocked multiplexer that selects the first write reference signal or the second write reference signal based on arrival of a clock signal from the clock generator.

13. The device of claim 10, wherein the load comprises write critical path circuitry for magneto-resistive random access memory (MRAM).

14. A device, comprising:
a clock generator that provides write reference signals;
a voltage divider that receives the write reference signals and provides an output reference signal that is proportional to a selected write reference signal of the write reference signals; and
a voltage regulator that receives the output reference signal and provides a regulated voltage to a load based on the output reference signal, the voltage regulator having an amplifier that uses dynamic body biasing of an input transistor to reduce static leakage while providing increased voltage headroom to a current source;
wherein the voltage regulator receives the write reference signals based on arrival of a clock signal from the clock generator, and wherein the voltage regulator provides the regulated voltage to the load based on arrival of the clock signal from the clock generator.

15. The device of claim 14, wherein the amplifier receives the output reference signal at an inverting input, and wherein the amplifier receives a feedback voltage at a non-inverting input, and wherein the feedback voltage is provided by a feedback divider that is coupled to an output of the amplifier via a pass transistor.

16. The device of claim 15, wherein the pass transistor is coupled between a voltage supply and the load, and wherein the pass transistor is activated by output of the amplifier, and wherein the feedback divider is coupled between an output of the pass transistor and the non-inverting input of the amplifier.

17. The device of claim 14, wherein the load comprises write critical path circuitry for magneto-resistive random access memory (MRAM).

\* \* \* \* \*